(12) United States Patent
Yin et al.

(10) Patent No.: US 8,814,283 B2
(45) Date of Patent: Aug. 26, 2014

(54) ELECTRONIC DEVICE WITH DETACHABLE HANDLE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Xiao-Gang Yin, Shenzhen (CN); Jun-Hui Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/859,743

(22) Filed: Apr. 10, 2013

(65) Prior Publication Data
US 2014/0177142 A1   Jun. 26, 2014

(30) Foreign Application Priority Data
Dec. 26, 2012  (CN) .......................... 2012 1 0573756

(51) Int. Cl.
A47B 95/02   (2006.01)

(52) U.S. Cl.
USPC .................... 312/244; 312/223.2; 361/679.59

(58) Field of Classification Search
USPC ................. 312/223.2, 244; 16/413, 415, 419; 403/353, 360, 375; 361/679.59
See application file for complete search history.

(56) References Cited

U.S. PATENT DOCUMENTS

| | | | | |
|---|---|---|---|---|
| 1,520,520 A * | 12/1924 | Thomason | ................ | 108/153.1 |
| 2,486,557 A * | 11/1949 | Flora | ................ | 16/413 |
| 5,075,926 A * | 12/1991 | Jeong | ................ | 16/429 |
| 5,143,331 A * | 9/1992 | Robert | ................ | 248/27.1 |
| 5,293,300 A * | 3/1994 | Leung | ................ | 361/679.59 |
| 5,845,978 A * | 12/1998 | Jung | ................ | 312/244 |
| 6,017,106 A * | 1/2000 | Adams et al. | ................ | 312/223.2 |
| 6,250,842 B1 * | 6/2001 | Kruger | ................ | 403/315 |
| 7,423,569 B2 * | 9/2008 | Cheung et al. | ................ | 341/144 |
| 8,059,396 B2 * | 11/2011 | Chen et al. | ................ | 361/679.37 |
| 8,570,738 B2 * | 10/2013 | Fan et al. | ................ | 361/679.59 |
| 8,670,233 B2 * | 3/2014 | Huang et al. | ................ | 361/679.59 |
| 2006/0157417 A1 * | 7/2006 | Wertz | ................ | 210/688 |
| 2011/0140584 A1 * | 6/2011 | Zhou | ................ | 312/223.2 |
| 2012/0170215 A1 * | 7/2012 | Fan et al. | ................ | 361/679.59 |
| 2013/0147329 A1 * | 6/2013 | Hu | ................ | 312/244 |

* cited by examiner

*Primary Examiner* — Daniel Rohrhoff
(74) *Attorney, Agent, or Firm* — Novak Druce Connolly Bove + Quigg LLP

(57) ABSTRACT

An electronic device includes a chassis and a handle. The chassis includes a side plate. Two first protrusions protrude from the side plate. Each first protrusion includes a neck and a head. The handle includes a main body. The main body includes two opposite end walls, and two mounting portions extending from the end walls. A first hooking slot is defined in each mounting portion. Each first hooking slot includes a first slot, and a second slot communicating with a bottom of the first slot and narrower than the first slot. A resilient tab is fastened to each end wall. A stop tab extends from each resilient tab. The first protrusions are operable to extend through the first slots and move toward the second slots. The necks engage in the second slots. The stop tabs block tops of the heads.

9 Claims, 5 Drawing Sheets

ELECTRONIC DEVICE WITH DETACHABLE HANDLE

BACKGROUND

1. Technical Field

The present disclosure relates to an electronic device.

2. Description of Related Art

Handles may be mounted on servers to make carrying the servers easier. However, the handles occupy space in the mounting areas when the servers are mounted in a server cabinet.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
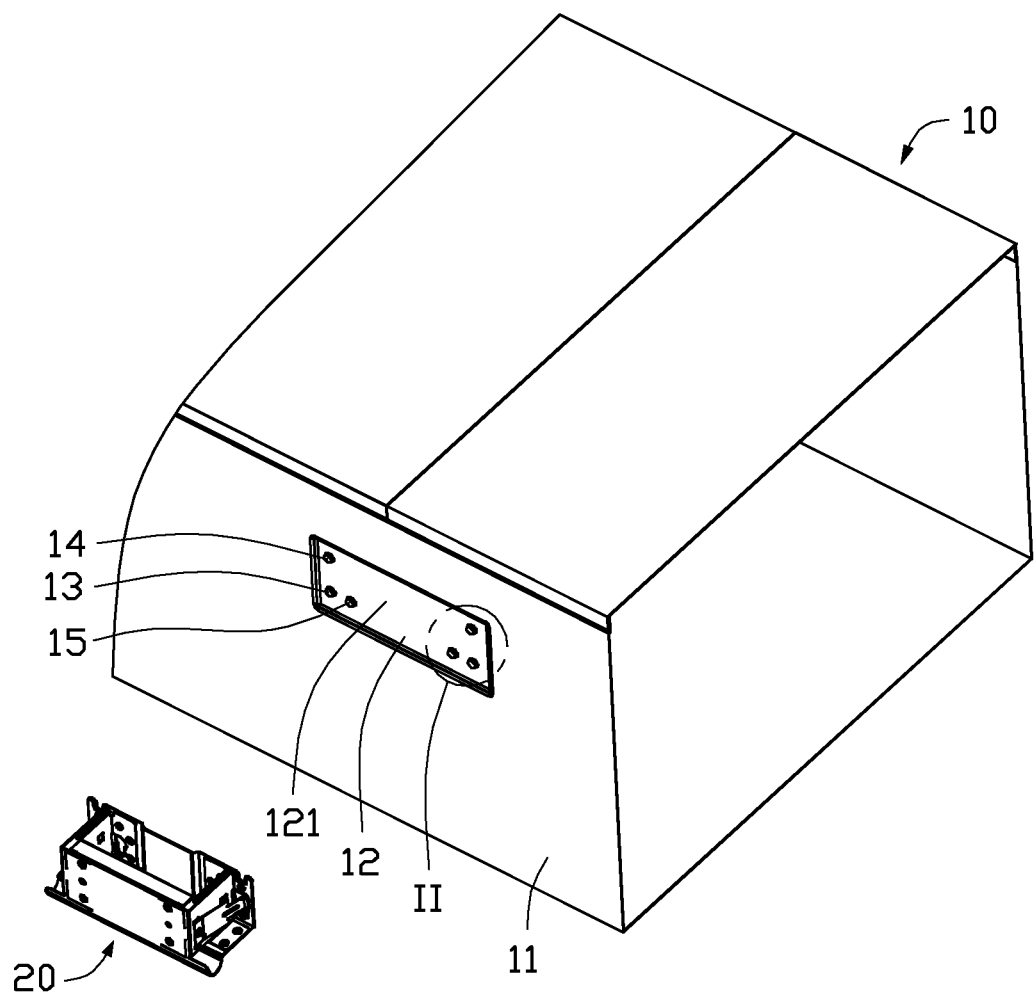
FIG. 1 is an exploded, isometric view of an embodiment of an electronic device, wherein the electronic device includes a handle.
Figure 2:
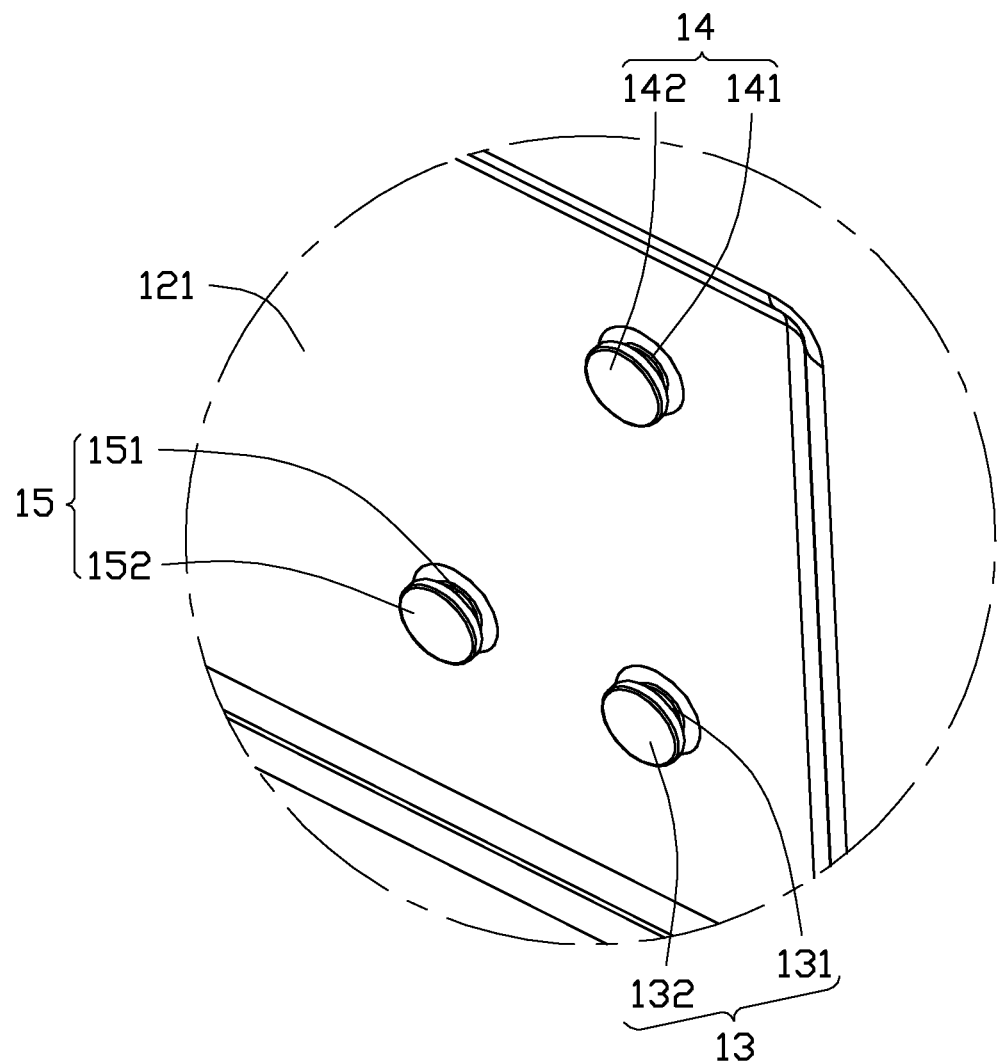
FIG. 2 is an enlarged view of a circled portion II of FIG. 1.

FIGS. 1 and 2 show an exemplary embodiment of an electronic device. The electronic device includes a chassis 10 and a handle 20.

A recess 12 is defined in an outer surface of a side plate 11 of the chassis 10. Two first protrusions 13, two second protrusions 14 respectively located above the first protrusions 13, and two third protrusions 15 located between the first protrusions 13 protrude from a bottom wall 121 bounding the recess 12. Each first protrusion 13 includes a neck 131 protruding from the bottom wall 121, and a head 132 wider than the neck 131 is formed on a distal end of the neck 131. Each second protrusion 14 includes a neck 141 protruding from the bottom wall 121, and a head 142 wider than the neck 141 is formed on a distal end of the neck 141. Each third protrusion 15 includes a neck 151 protruding from the bottom wall 121, and a head 152 wider than the neck 151 is formed on a distal end of the neck 151. Ends of the first protrusions 13, the second protrusions 14, and the third protrusions 15 away from the bottom wall 121 are roughly coplanar with the outer surface of the side plate 11.

Figure 3:
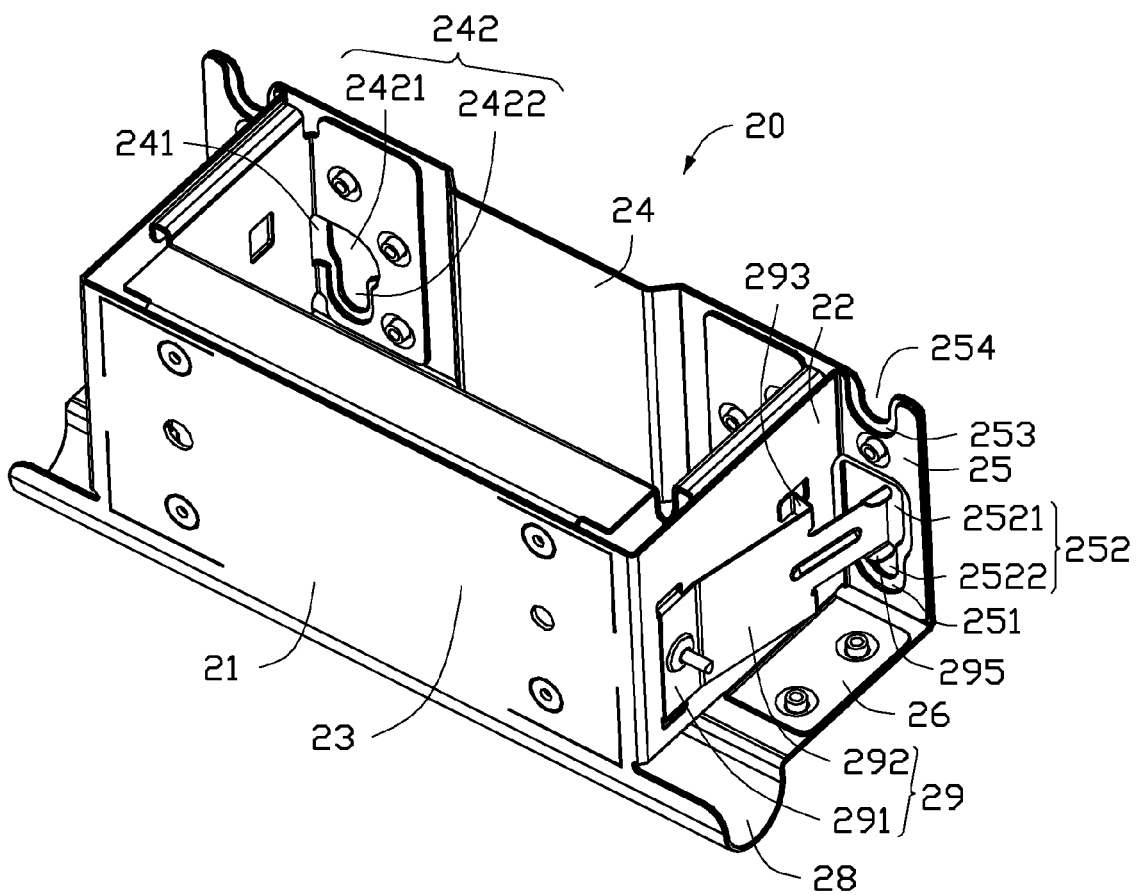
FIG. 3 is an enlarged view of the handle of FIG. 1.

FIG. 3 shows the handle 20 including a main body 21. The main body 21 includes two opposite end walls 22, a first sidewall 24 connected between rear ends of the end walls 22, and a second sidewall 23 connected between front ends of the end walls 22. Two mounting portions 25 extend from opposite ends of the first sidewall 24. A connection portion 26 extends forward from a bottom of each mounting portion 25. A semi-circular grip portion 28 extends from a bottom of the second sidewall 23 and connected to front ends of the connection portions 26.

A first receiving slot 251 is defined in a front side of each mounting portion 25. A first hooking slot 252 is defined in a rear side of each mounting portion 25, communicating with the corresponding first receiving slot 251. The first hooking slot 252 includes a first slot 2521, and a second slot 2522 communicating with a bottom of the first slot 2521 and narrower than the first slot 2521. A second receiving slot 253 is defined in the front side of a top end of each mounting portion 25. A second hooking slot 254 is defined in the rear side of each mounting portion 25, communicating with the corresponding second receiving slot 253. Two third receiving slots 241 are defined in opposite ends of a front side of the first sidewall 24. Two third hooking slots 242 are defined in a rear side of the first sidewall 24, respectively communicating with the third receiving slots 241. Each third hooking slot 242 includes a first slot 2421, and a second slot 2422 communicating with a bottom of the first slot 2421 and narrower than the first slot 2421.

A resilient tab 29 is fastened to each end wall 22. The resilient tab 29 includes a fastening portion 291 fastened to an outer side of the end wall 22, and a resilient portion 292 slantingly extending back and away from the end wall 22 from the fastening portion 291. Two L-shaped abutting tabs 293 extend from opposite sides of the resilient portion 292 and abut against the end wall 22. A stop tab 295 extends from a bottom of a rear end of the resilient portion 292.

Figure 4:
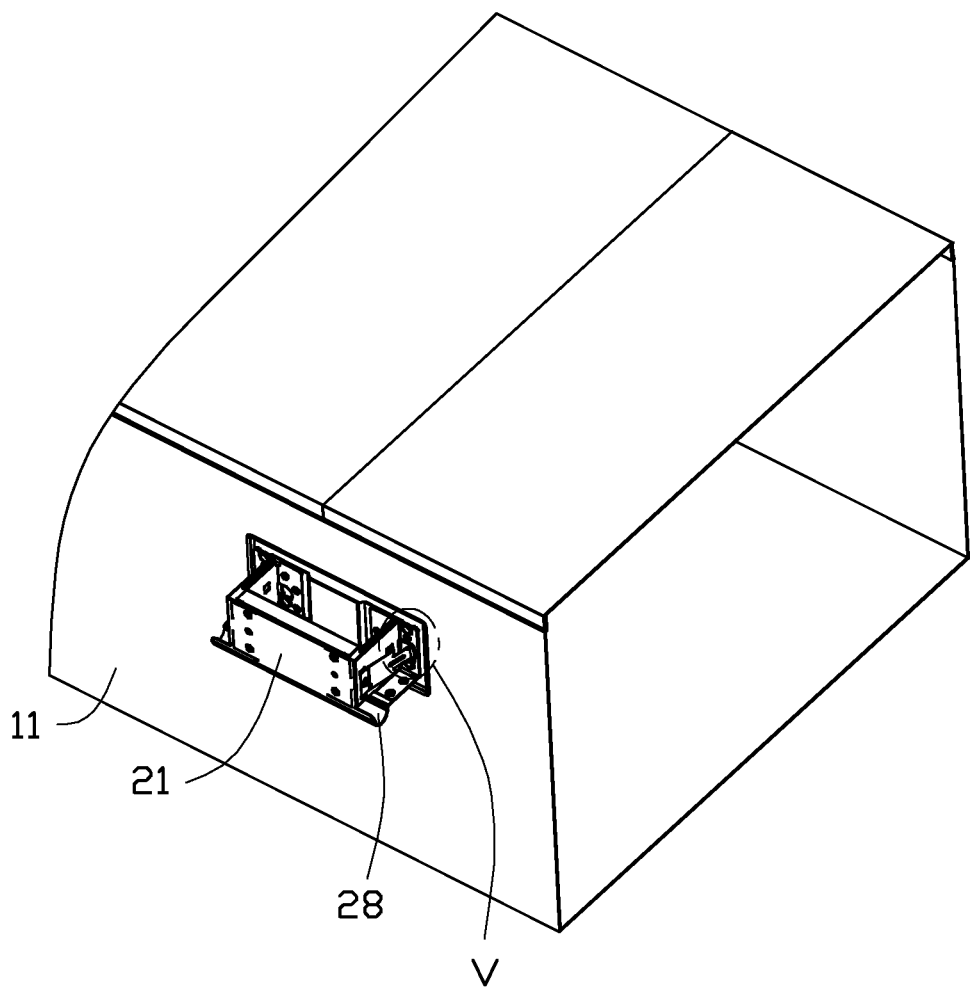
FIG. 4 is an assembled, isometric view of FIG. 1.
Figure 5:
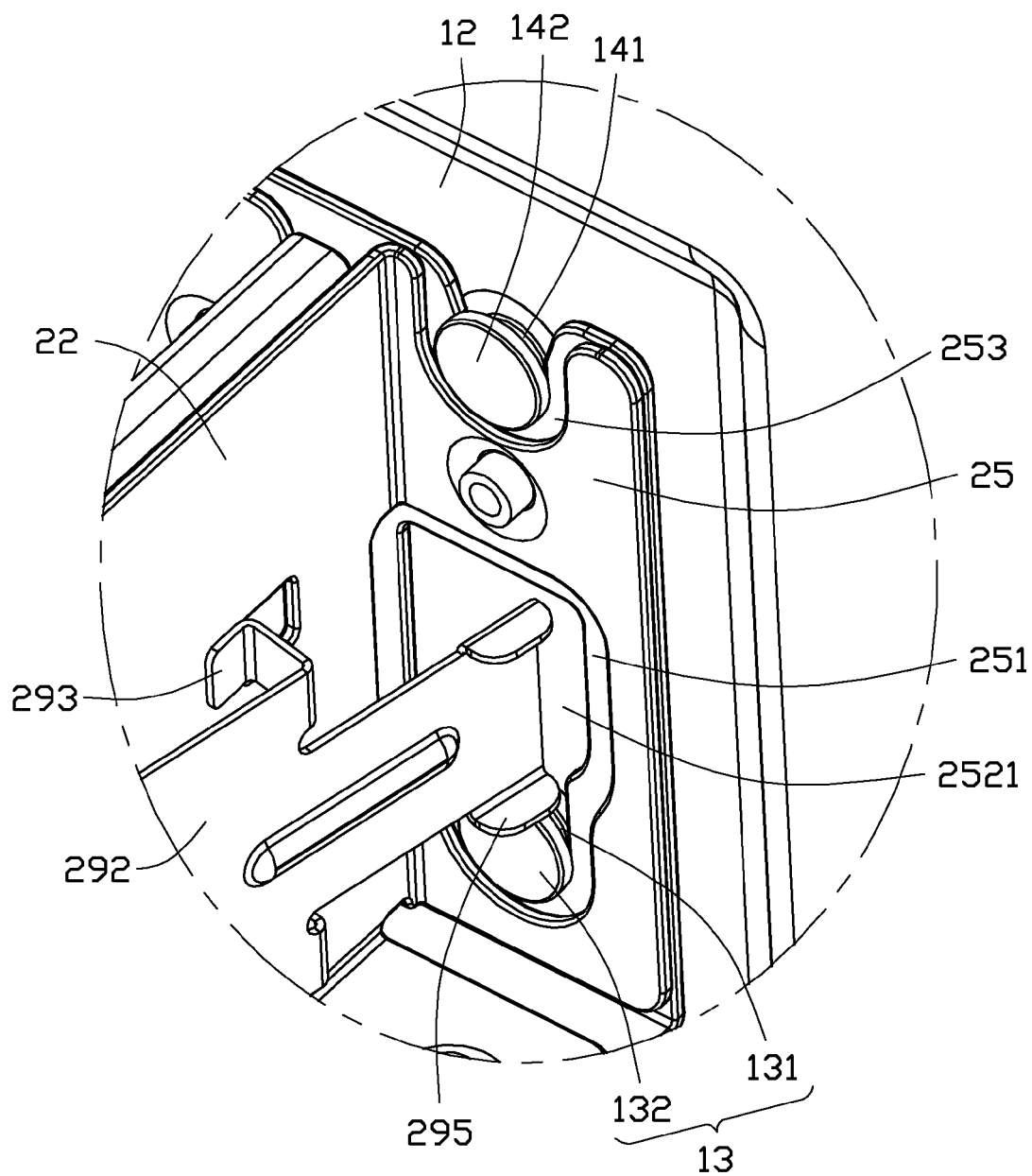
FIG. 5 is an enlarged view of a circled portion V of FIG. 4.

Referring to FIGS. 4 and 5, in assembly, the resilient tabs 29 are pulled outward. The handle 20 is moved toward the recess 12. The first sidewall 24 abuts against the bottom wall 121. The first protrusions 13 extend through the first slots 2521, and the third protrusions 15 extend through the first slots 2421. The second protrusions 14 are respectively located above the second hooking slots 254. The handle 20 is moved up. The necks 131 engage in the second slots 2522, and the heads 132 are received in bottoms of the first receiving slots 251. The necks 141 engage in the second hooking slots 254, and the heads 142 are received in the second receiving slots 253. The necks 151 engage in the second slots 2422, and the heads 152 are received in bottoms of the third receiving slots 241. The resilient tabs 29 are released to be restored, the stop tabs 295 block tops of the heads 132. The abutting tabs 293 abut against the end walls 22. Thereby, the handle 20 is detachably connected to the chassis 10. An operator may grip the grip portion 28, to carry the chassis 10.

When the electronic device is carried to a receiving space, the handle 20 can be detached from the chassis 10, to save the space occupied by the chassis 10.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. An electronic device, comprising:
    a chassis comprising a side plate, two first protrusions protruding from the side plate, each first protrusion comprising a neck and a head formed on a distal end of the neck; and
    a handle comprising a main body, the main body comprising two opposite end walls, and two mounting portions extending from the end walls, each mounting portion defining a first hooking slot, each first hooking slot comprising a first slot, and a second slot communicating with a bottom of the first slot and narrower than the first slot, a resilient tab fastened to each end wall, a stop tab extending from each resilient tab;

wherein the first protrusions are operable to extend through the first slots and move toward the second slots, the necks engage in the second slots, the stop tabs block tops of the heads.

2. The electronic device of claim 1, wherein each resilient tab comprises a fastening portion fastened to the corresponding end wall, and a resilient portion slantingly extending back from the fastening portion.

3. The electronic device of claim 2, wherein an abutting tab extends from each resilient portion and abuts against the corresponding end wall.

4. The electronic device of claim 3, wherein the abutting tab is substantially L-shaped.

5. The electronic device of claim 1, wherein a first receiving slot is defined in a front side of each mounting portion, the first hooking slots are defined in rear sides of the mounting portions and communicating with the first receiving slots of the mounting portions, the heads are received in the first receiving slots.

6. The electronic device of claim 5, wherein a second protrusion protrudes from each mounting portion and is located above the corresponding first protrusion, a second receiving slot is defined in the front side of a top end of the mounting portion, a second hooking slot is defined in the rear side of the mounting portion and communicating with the second receiving slot, each second protrusion comprises a neck engaging in the corresponding second hooking slot, and a head received in the second receiving slot.

7. The electronic device of claim 6, wherein a first sidewall is connected between rear ends of the end walls, a third protrusion protrudes from the side plate and located between the first protrusions, a third receiving slot is defined in a front side of the first sidewall, a third hooking slot is defined in a rear side of the first sidewall and communicating with the third receiving slot, the third hooking slot comprises a first slot, and a second slot communicating with a bottom of the first slot and narrower than the first slot, the third protrusion comprises a neck engaging in the second slot of the third hooking slot, and a head formed on a distal end of the neck and received in the third receiving slot.

8. The electronic device of claim 7, wherein a recess is defined in the side plate, the first protrusions, the second protrusions, and the third protrusion protrude from a bottom wall bounding the recess, ends of the first protrusions, the second protrusions, and the third protrusion away from the bottom wall are roughly coplaner with an outer surface of the side plate.

9. The electronic device of claim 1, wherein a second sidewall is connected between front ends of the end walls, a semicircular grip portion extends from a bottom of the second sidewall.

* * * * *